United States Patent
Chandra et al.

(10) Patent No.: US 8,164,964 B2
(45) Date of Patent: Apr. 24, 2012

(54) BOOSTING VOLTAGE LEVELS APPLIED TO AN ACCESS CONTROL LINE WHEN ACCESSING STORAGE CELLS IN A MEMORY

(75) Inventors: Vikas Chandra, Fremont, CA (US); Cezary Pietrzyk, Los Gatos, CA (US); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 333 days.

(21) Appl. No.: 12/591,751

(22) Filed: Nov. 30, 2009

(65) Prior Publication Data

US 2011/0063932 A1    Mar. 17, 2011

(51) Int. Cl.
*G11C 7/00*    (2006.01)
(52) U.S. Cl. ............... 365/194; 365/230.08; 365/233.11
(58) Field of Classification Search ............ 365/189.03, 365/189.07, 189.08, 194, 230.05, 230.08, 365/233.11, 233.12
See application file for complete search history.

(56) References Cited

U.S. PATENT DOCUMENTS

| | | | |
|---|---|---|---|
| 5,297,104 A | 3/1994 | Nakashima | |
| 2002/0118568 A1* | 8/2002 | Tanzawa | ............... 365/185.11 |
| 2004/0062115 A1* | 4/2004 | Takeuchi et al. | ............ 365/202 |
| 2005/0157533 A1 | 7/2005 | Kaal | |
| 2009/0103375 A1 | 4/2009 | Houston | |

OTHER PUBLICATIONS

C. Wang et al, "A Boosted Wordline Voltage Generator for Low-Voltage Memories" ICECS-2003, 2003, pp. 806-809.
E. Grossar et al, "Read Stability and Write-Ability Analysis of SRAM Cells for Nanometer Technologies" *IEEE Journal of Solid-State Circuits*, vol. 41, No. 11, Nov. 2006, pp. 2577-2588.
B. Calhoun et al, "A 256-kb 65-nm Sub-threshold SRAM Design for Ultra-Low-Voltage Operation" *IEEE Journal of Solid-State Circuits*, vol. 42, No. 3, Mar. 2007, pp. 680-688.
I. Carlson et al, "A High Density, Low Leakage, 5T SRAM for Embedded Caches" IEEE, 2004, pp. 215-218.
L. Chang et al, "A 5.3GHz 8T-SRAM with Operation Down to 0.41V in 65nm CMOS" *2007 Symposium on VLSI Circuits Digest of Technical Papers*, 2007, pp. 252-253.
B. Cheng et al, "The Scalability of 8T-SRAM Cells under the Influence of Intrinsic Parameter Functuations" IEEE, 2007, pp. 93-96.

(Continued)

*Primary Examiner* — Alexander Sofocleous
*Assistant Examiner* — Hien Nguyen
(74) *Attorney, Agent, or Firm* — Nixon & Vanderhye P.C.

(57) ABSTRACT

A semiconductor memory storage device is disclosed, the memory comprises: a plurality of storage cells for storing data; at least two access control lines each for controlling access to a respective at least one of the plurality of storage cells; at least two access control circuits each for controlling a voltage level supplied to a corresponding one of the at least two access control lines in response to an access request, the at least two access control circuits each comprising a capacitor and switching circuitry; routing circuitry for routing the access request and a boost signal to a selected one of the at least two access control circuits in dependence upon an address associated with the access request; wherein the at least two access control circuits are each responsive to: receipt of the access request from the routing circuitry to connect the selected access control line to a supply voltage; and receipt of the boost signal from the routing circuitry to disconnect the supply voltage from the access control line and to couple the boost signal to the access control line through the capacitor of the access control circuit to provide a boost to a voltage level on the access control line.

20 Claims, 6 Drawing Sheets

OTHER PUBLICATIONS

W. Dehaene et al, "Embedded SRAM design in deep deep submicron technologies" IEEE, 2007, pp. 384-391.

R. Hobson, "A New Single-Ended SRAM Cell With Write-Assist" *IEEE Transactions on Very Large Scale Integration (VLSI) Systems*, vol. 15, No. 2, Feb. 2007, pp. 173-181.

J. Wang et al, "Analyzing Static and Dynamic Write Margin for Nanometer SRAMs" *ISLPED '08*, Aug. 2008, pp. 129-134.

A. Kawasumi et al, "A Single-Power-Supply 0.7V 1GHz 45nm SRAM with an Asymmetrical Unit-β-ratio Memory Cell" *2008 IEEE International Solid-State Circuits Conference*, 2008, pp. 382, 383, 622.

M. Khellah et al, "Read and Write Circuit Assist Techniques for Improving Vccmin of Dense 6T SRAM Cell" *IEEE Int'l Conf. on Integrated Circuit Design and Technology*, 2008.

J. Kulkarni et al, "A 160 mV Robust Schmitt Trigger Based Sub-threshold SRAM" *IEEE Journal of Solid-State Circuits*, vol. 42, No. 10, Oct. 2007, pp. 2303-2313.

R. Kumar et al, "A Family of 45nm IA Processors" *2009 IEEE International Solid-State Circuits Conference*, 2009, pp. 58-59.

S. Nalam et al, "Asymmetric Sizing in a 45nm 5T SRAM to Improve Read Stability over 6T" *IEEE 2009 Custom Intergrated Circuits Conference (CICC)*, 2009, pp. 709-712.

H. Pilo et al, "An SRAM Design in 65-nm Technology Node Featuring Read and Write-Assist Circuits to Expand Operating Voltage" *IEEE Journal of Solid-State Circuits*, vol. 42, No. 4, Apr. 2007, pp. 813-819.

J. Poulton, "An Embedded DRAM for CMOS ASICs" IEEE, 1997, pp. 288-302.

E. Seevinck et al, "Static-Noise Margin Analysis of MOS SRAM Cells" *IEEE Journal of Solid-State Circuits*, vol. SC-22, No. 5, Oct. 1987, pp. 748-754.

T. Suzuki et al, "A Stable 2-Port SRAM Cell Design Against Simultaneously Read/Write-Disturbed Accesses" *IEEE Journal of Solid-State Circuits*, vol. 43, No. 9, Sep. 2008 pp. 2109-2119.

Y. Ye et al, "Evaluation of Differential vs. Single-Ended Sensing and Asymmetric Cells in 90nm Logic Technology for On-Chip Caches" *ISCAS 2006*, pp. 963-966.

Y. Kim et al, "New SRAM Cell Design for Low Power and High Reliability using 32nm Independent Gate FinFET Technology" *IEEE International Workshop on Design and Test of Nano Devices, Circuits and Systems*, 2008, pp. 25-28.

M. Iijima et al, "Low Power SRAM with Boost Driver Generating Pulsed Word Line Voltage for Sub-1V Operation" *Journal of Computers*, vol. 3, No. 5, May 2008, pp. 34-40.

H. Morimura et al, "A Step-Down Boosted-Wordline Scheme for 1-V Battery-Operated Fast SRAM's" *IEEE Journal of Solid-State Circuits*, vol. 33, No. 8, Aug. 1998, pp. 1220-1227.

U.S. Appl. No. 12/591,511, filed Nov. 20, 2009, Idgunji et al.

Office Action mailed Jul. 19, 2011 in co-pending U.S. Appl. No. 12/591,511.

* cited by examiner

BOOSTING VOLTAGE LEVELS APPLIED TO AN ACCESS CONTROL LINE WHEN ACCESSING STORAGE CELLS IN A MEMORY

BACKGROUND OF THE INVENTION

1. Field of the Invention

The field of the invention relates to the field of data storage and in particular, to the storage and access of data in semiconductor memories.

2. Description of the Prior Art

With ever increasing demands to reduce both the size of devices and their power consumption, it is becoming increasingly challenging to design robust semiconductor memories such as SRAM. Each storage cell in an SRAM comprises a feedback loop for holding a data value. In order to write to the feedback loop and store a new value, the input data value must have a high enough voltage level to be able to switch the state stored by the feedback loop if required, while reading from the feedback loop should be performed without disturbing the values stored in any of the feedback loops.

As dimensions scale down the variations in device properties due to random dopant fluctuations, line edge roughness etc. increase drastically.

Thus, designing a robust SRAM where cells can written to across all operational voltage ranges turns out to be very difficult. Reducing the voltage at which the SRAM cells can be read and written to successfully is not easy and in particular as the voltage scales down it becomes increasingly difficult to write to the cells.

One proposed way of addressing the write problem is disclosed in "Low power SRAM with Boost Driver Generating Pulsed Word Line Voltage for Sub-IV Operation" by Iijima et al. Journal of Computers, vol 3, No 5 May 2008. FIG. 1 shows a circuit for boosting the word line voltage according to the technique disclosed in this article. In this circuit an active body-biasing controlled boost transistor generates a boost to the word line voltage thereby facilitating writes by capacitive coupling only when the word line is accessed. A drawback of this scheme is that there is a significant area overhead resulting from having one extra transistor per word line. Furthermore, since the signal controlling the PMOS pass gate is shorted to the back of the capacitive coupling transistor there is an inherent delay in turning off the PMOS pass gate. As a result of this delay some coupled charge will leak from the Vwl node through the partially turned on PMOS. This significantly reduces the efficiency of this scheme.

It would be desirable to be able to reduce write failures particularly during low voltage operation of a semiconductor memory.

SUMMARY OF THE INVENTION

A first aspect of the present invention provides a semiconductor memory storage device comprising: a plurality of storage cells for storing data; at least two access control lines each for controlling access to a respective at least one of said plurality of storage cells; at least two access control circuits each for controlling a voltage level supplied to a corresponding one of said at least two access control lines in response to an access request, said at least two access control circuits each comprising a capacitor and switching circuitry; routing circuitry for routing said access request and a boost signal to a selected one of said at least two access control circuits in dependence upon an address associated with said access request; wherein said at least two access control circuits are each responsive to: receipt of said access request from said routing circuitry to connect said selected access control line to a supply voltage; and receipt of said boost signal from said routing circuitry to disconnect said supply voltage from said access control line and to couple said boost signal to said access control line through said capacitor of said access control circuit to provide a boost to a voltage level on said access control line.

The present invention recognises the problems of writing a data value to a semiconductor memory in systems where operational voltages and memory sizes are decreasing. It addresses this problem by providing a way of boosting the voltage level on an access control line during an access request and thereby increasing the chances of this voltage level being sufficient to trigger a change in data value if required. Furthermore, rather than providing a circuit for providing this boost for each access control line, with the attendant disadvantage of significantly increasing the area of the memory, it provides routing circuitry for routing the boost signal to a particular selected access control line, such that a boost signal can be generated for multiple access control lines and then routed to the appropriate one.

In some embodiments, said semiconductor memory further comprises at least one delay circuit for generating said boost signal from said access request, said routing circuitry being configured to route said boost signal to said selected one of said at least two access control circuit.

It may be advantageous for the semiconductor memory to have a delay circuit to generate the boost signal from the access request. This boost signal is then routed to the selected access control circuit to provide an appropriate voltage boost on the access control line. In this way, a boost to the access control line voltage is provided shortly after the access request selects the access control line and thus, an increased voltage is present when required. It should be noted that an optimal delay between the access request and the boost signal for a particular memory may in some cases be quite long and thus, the delay circuit needed to generate this delay may be quite large. In such a case, having a single delay circuit for generating a boost signal for multiple access control lines provides a memory that is much more area efficient than one where each access control line has its own delay circuit for generating the boost signal.

Furthermore, by generating this boost signal at a delay circuit independent to the access control circuit, overlaps between the access request signal and the boost signal which can result in a waste in the timing/power budget can be more easily avoided.

In some embodiments, said semiconductor memory comprises a boost signal input for receiving said boost signal from upstream logic.

Although the delay circuit for generating the boost signal may be in the semiconductor memory device itself, in other embodiments it may be provided in upstream logic and the semiconductor memory device may have an input for receiving this signal. In such a case, the semiconductor memory storage device can be smaller, however, in this case the memory will not be able to independently provide the boost signal and thus, it must have associated upstream logic to provide a boost to the access control line voltage.

In some embodiments, said at least two access control circuits are each configured to precharge said capacitor of said access control circuit in response to receipt of said access request by said access control circuit.

The boost voltage is provided by a capacitor in the access control circuit that couples the boost signal to the access control line. In order for this to provide an appropriate boost it should be pre-charged and thus, in some embodiments receipt of the access request signal pre-charges the capacitor. As the boost signal is received after a delay with respect to the access request signal the capacitor has been charged when this signal is received and thus, the boost signal can be coupled through the charged capacitor and provide the appropriate boost to the access control line.

In some embodiments, said access request is formed from a clock signal and an address signal, said address signal indicating said access control line to be selected and said clock signal synchronising access to said selected storage cell.

The access request can have a number of forms, but in some embodiments it comprises a clock signal and an address signal. The address signal provides the information regarding which storage cell and thus, which access control line is to be selected, while the clock signal synchronises the access request.

In some embodiments, said boost signal is generated from said clock signal, and has a delay with respect to said clock signal.

Where the access request signal is formed from a clock signal and an address signal, the boost signal may be generated from a delayed version of the clock signal. It is the clock signal that synchronises the access and thus, generating the boost signal from the clock signal is an appropriate way of providing a signal with a suitable delay.

In some embodiments, said switching circuitry of said access control circuit comprises a switch for connecting said capacitor and access control line to said supply voltage and for isolating said capacitor and access control line from said supply voltage said switch being responsive to said access request and to said boost signal, said switching circuitry comprising a further switch for connecting said access control line and said capacitor to a low voltage supply to discharge said capacitor and access control line, said further switch being responsive to a discharge signal.

In order for the timing of the access control circuit to be correct, a switch can be used that is responsive to the access request to connect the capacitor to the supply voltage and thus precharge it and to connect the access control line to the supply voltage too. In response to receipt of the boost signal, the switch then isolates the capacitor and the access control line from the supply voltage and the boost signal is coupled to the access control line via the charged capacitor. The access control circuit may also have a further switch for discharging the access control line and the capacitor in response to a discharge signal.

In some embodiments, said discharge signal comprises said clock signal, such that during one phase of said clock signal said further switch connects said access control line and said capacitor to said lower voltage supply, and during the other phase of said clock signal said further switch isolates said access control line and said capacitor from said lower voltage supply, said switch connecting said capacitor and said access control line to said supply voltage during said other phase of said clock signal.

The discharge signal can be formed from the clock signal that is part of the access request signal such that during one phase of this clock signal the access control line and the capacitor are connected to the lower voltage supply and are discharged and during the other phase they are isolated from this lower voltage supply and during this other phase the capacitor is precharged and the access control line is connected to the supply voltage and its voltage is boosted. Using the clock signal in this way provides an effective way of timing the accesses and the boosting of the access control line voltage.

In some embodiments, said capacitor is a tuneable capacitor.

It may be advantageous for the capacitor within the access control circuit to be a tuneable capacitor. This would enable the amount of boost provided to the access control line to be varied as required. The tuneable capacitor may be a capacitor whose capacitance value is tuned at the design stage depending on the design requirements of a particular memory, or it may be a capacitor that is tuneable in use such that in use the level of the boost value can be varied by tuning the capacitor as required for operational reasons. Tuneable capacitors are known in the art and may be formed in a number of ways. In some embodiments the tuneable capacitor is tuned by modulating the substrate or body voltage of the device.

In some embodiments, said delay circuit is configurable to vary said delay in dependence upon a boost required.

It may also be desirable to be able to vary the delay provided between the access request and the boost signal. Thus, in some embodiments the delay circuit can be configurable such that the time between receipt of the access request and receipt of the boost signal can be varied. In this way the semiconductor memory can be tuned in dependence upon certain conditions. Having a delay circuit that provides a boost signal to multiple access control lines means that control of the delay is performed centrally for all of these access control lines which is an efficient way of controlling and tuning the memory according to operational requirements.

Although the capacitor can be formed in a number of ways, in some embodiments it comprises a MOS gate capacitor. This is a simple and area efficient way of providing the capacitor.

Although the semiconductor memory storage device can have a number of forms, in some embodiments it comprises an SRAM memory. The use of SRAM memories is widespread and these memories experience write-ability problems as they have their size and operational voltage levels scaled down. Thus, this technique is particularly effective with these memories.

In some embodiments, said access request comprises a write request.

The problem of area scaling and voltage scaling makes the writing to the storage cells particularly problematic. Thus, this technique is particularly appropriate where the access request is a write request. However, there are some circumstances where it can be used for read requests as well. These circumstances may be where the stability of the cells are high and the performance of the read is important. An increase in voltage on the access control line during a read may make it more likely that the stored values in other cells are disturbed during the read but it also increases the speed of the read. Thus, in some circumstances it may be advantageous to provide the boost during the read.

A second aspect of the present invention provides, a method of accessing a storage cell within a semiconductor memory storage device, said semiconductor memory storage device comprising: a plurality of storage cells for storing data; at least two access control lines each for controlling access to a respective at least one of said plurality of storage cells; at least two access control circuits each for controlling access to a respective one of said at least two access control lines; routing circuitry; said method comprising the steps of receiving an access request; routing said access request and a boost signal via said routing circuitry to a selected one of said at least two access control circuits in dependence upon an address associated with said access request; in response to receipt of said access request said selected access control circuit connecting said respective access control line to a supply voltage; and in response to receipt of said boost signal said selected access control circuit disconnecting said supply voltage from said access control line and coupling said boost signal to said access control line through a capacitor of said access control circuit to provide a boost to a voltage level on said access control line to facilitate said access.

A third aspect of the present invention provides, a semiconductor means for storing data comprising: a plurality of storage cell means; at least two access control line means each for controlling access to a respective at least one of said plurality of storage cell means; at least two access control means each for controlling a voltage level supplied to a corresponding one of said at least two access control line means in response to an access request, said at least two access control means each comprising capacitor and switching means; routing means for routing said access request and a boost signal to a selected one of said at least two access control means in dependence upon an address associated with said access request; wherein said at least two access control means are each responsive to: receipt of said access request from said routing means to connect said selected access control line means to a supply voltage; and receipt of said boost signal from said routing means to disconnect said supply voltage from said access control line means and to couple said boost signal to said access control line means through said capacitor of said access control means to provide a boost to a voltage level on said access control line means.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
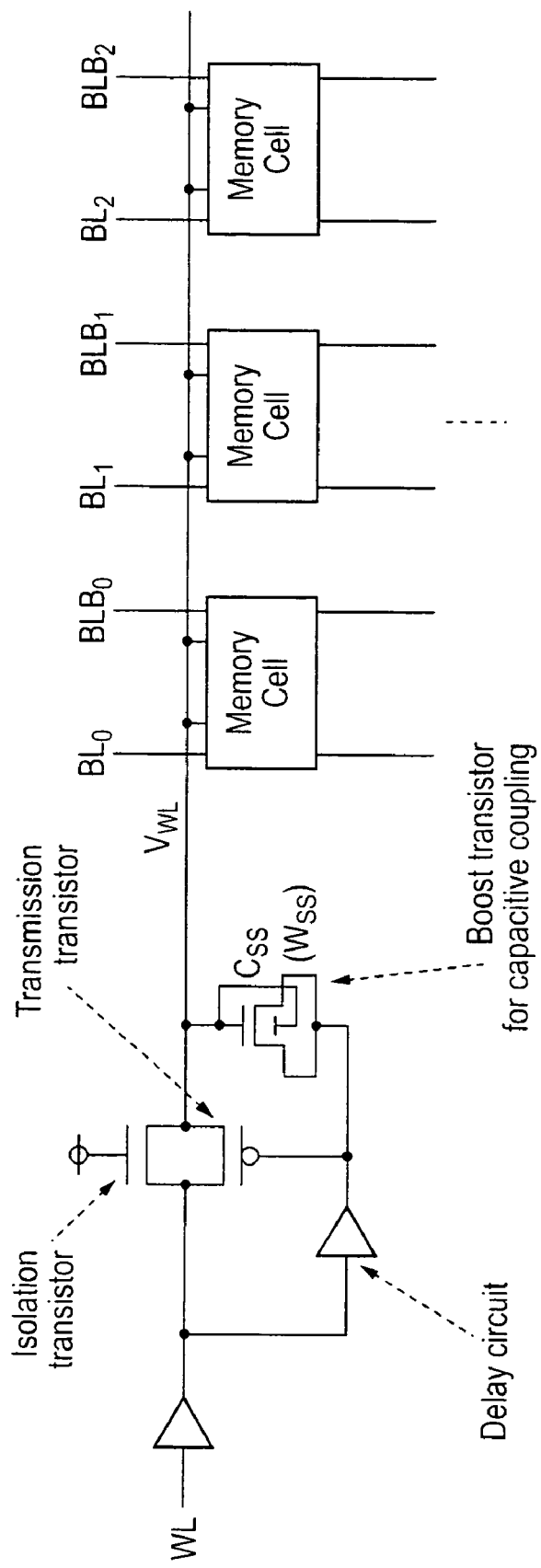
FIG. 1 shows a word line driver with boost functionality according to the prior art.
Figure 2:
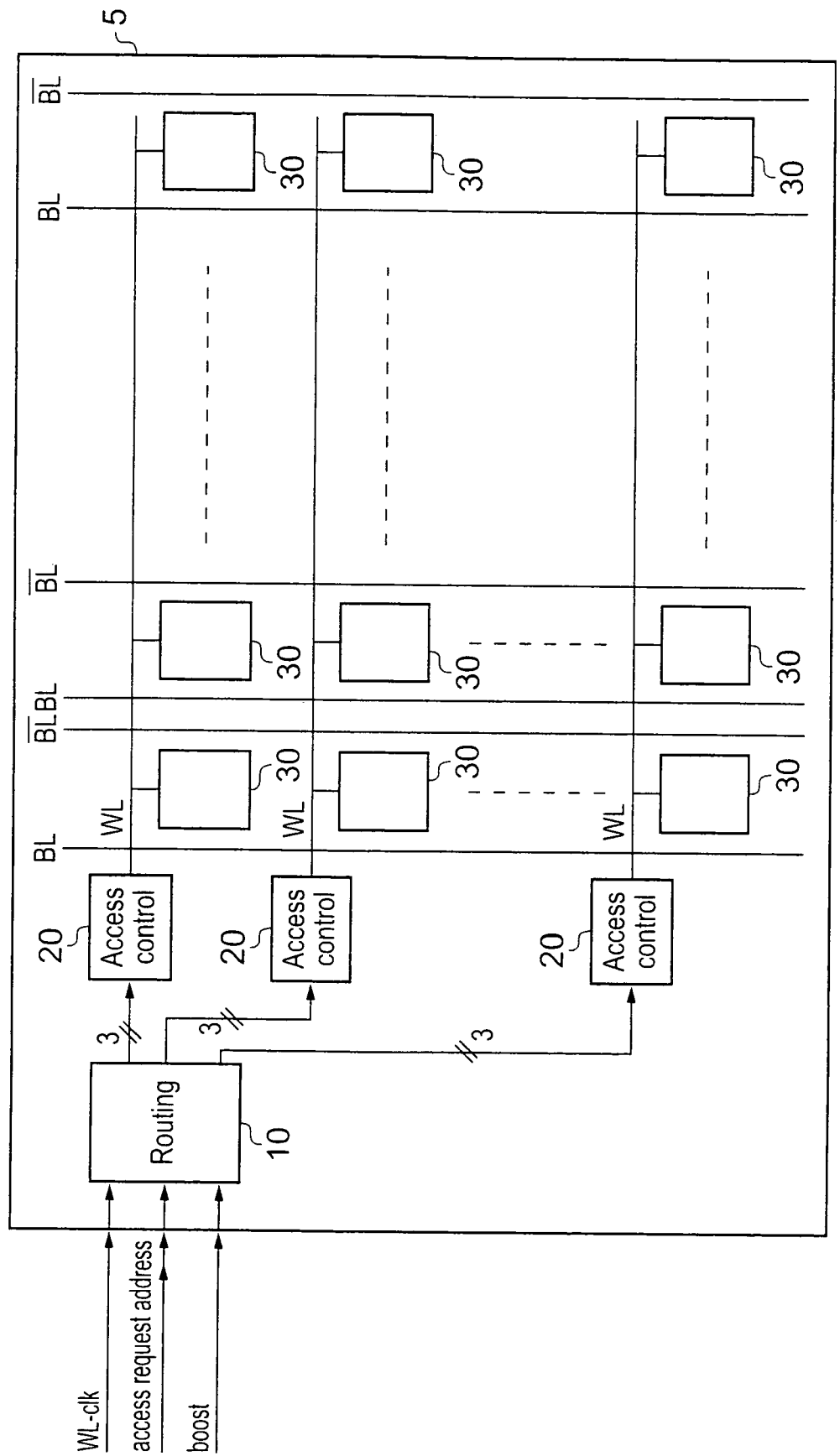
FIG. 2 shows a memory according to an embodiment of the present invention.

FIG. 2 shows a memory 5 according to an embodiment of the present invention. Memory 5 comprises a plurality of data storage cells 30 arranged in an array with requests to access data being made along a selected row of the array via word lines WL.

In response to an access request a word line for a row that contains the selected cell is fired to enable cells in that row to be accessed. Then the bit line and complementary bit line for the column that the selected cell is in are activated and a data value is read from or written to the cell depending on the access request.

Access request signals for accessing particular storage cells are received from upstream processing logic in a data processing apparatus. In the case of the access request being a write request, then the write must be sufficient to switch the state stored in the cell if required and this may be difficult, particularly at low operating voltage levels. In order to ensure that the write is able to function correctly, a boost signals for boosting a voltage on the word line to enable a write access request to be performed successfully is also received from upstream logic.

The access request is received at an input and consists of a clock signal WL_clk and an access request address which specifies the storage cell to be accessed and hence indicates which word line needs to be fired. The boost signal is a delayed version of the clock signal and in this embodiment is also received at an input. The routing circuitry 10 routes both the word line clock signal WL_clk and the boost signal to the appropriate word line via access control circuit 20 in dependence upon the address associated with the access request. In response to the received clock signal, the access control circuit 20 fires the word line and the storage cells 30 connected to this word line can then be accessed. In order to improve the probability of a write success if the access is a write request and to improve the speed of a read where the access request is a read request, the voltage level applied to the fired word line is boosted in response to the boost signal that is also received at the access control circuit a slight time after the access request.

The bit line and complementary bit line corresponding to the column that the selected cell is in are also activated and it is this cell whose value is written to in the case of a write while the other cells in the row retain their stored values. In the case of a read the stored value is output via the bit line and complementary bit line.

In the embodiment shown in FIG. 2, the boost signal is generated externally to the memory and thus, there is no circuit overhead associated with generating this signal within the memory itself. However, there is a requirement that there is upstream logic that can provide a boost signal with a suitable delay with respect to the access request signal. Generating the boost signal in this way reduces the size of the memory compared to one where the boost signal is generated within it. It also allows central upstream control of the delay to the boost signal which may in some circumstances be advantageous.

Figure 3:
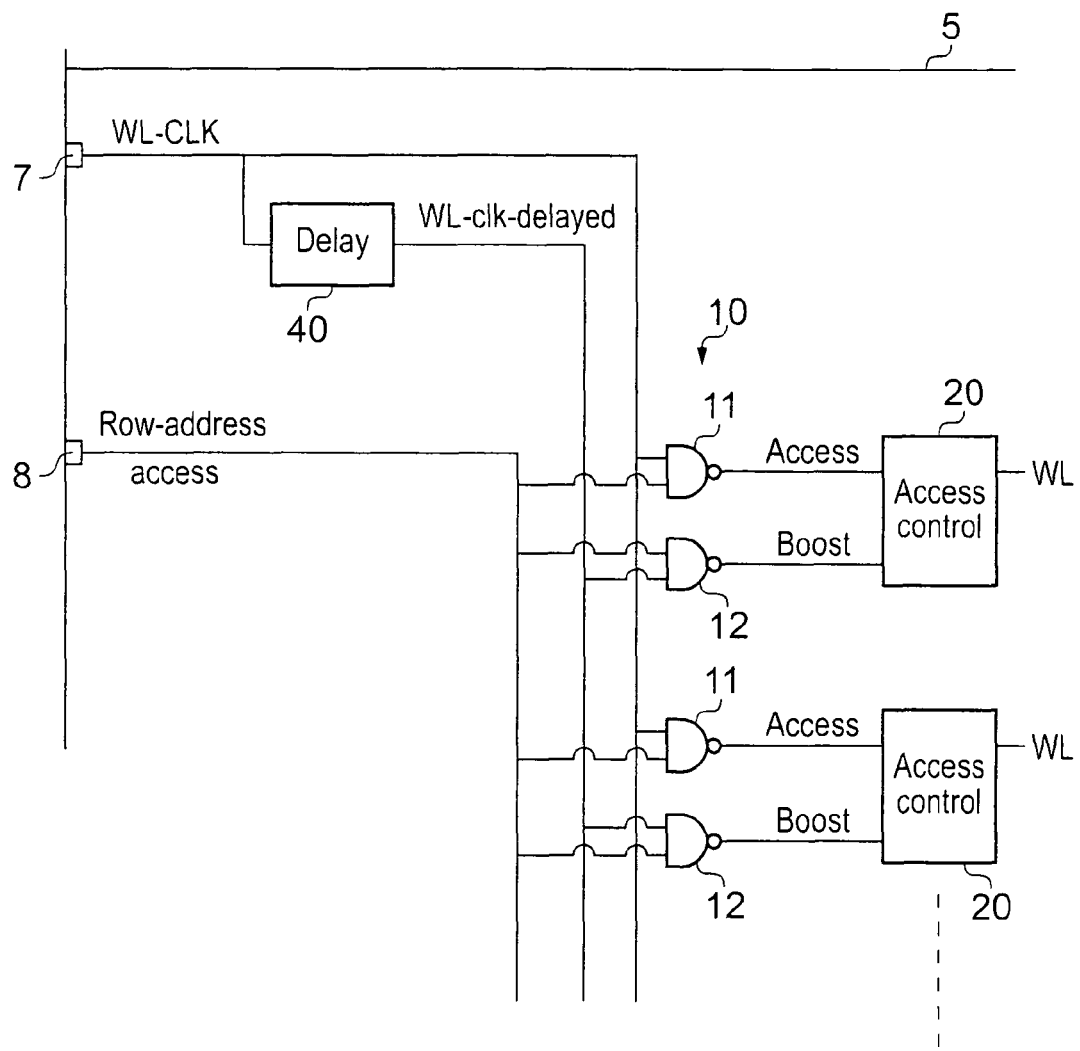
FIG. 3 shows a portion of a memory according to another embodiment of the present invention.

FIG. 3 shows an alternative embodiment where the boost signal is generated within the semiconductor memory 5 itself. In this Figure only a portion of the semiconductor memory 5 is shown. This portion shows an input 7 for receiving the clock signal WL_clk and an input 8 for receiving the row address of the access request. FIG. 3 also shows two access control circuits 20 that drive two different word lines.

In this embodiment, the semiconductor memory 5 also comprises a delay circuit 40 for generating the boost signal WL_clk_delayed as a delayed version of the access request clock WL_clk.

Routing of the signal to the particular access control circuit 20 and thus to the appropriate word line WL is done via routing circuitry 10 which in this case comprises NAND gates 11 and 12, for routing the access request and the boost signal respectively. Each of these NAND gates has the row address signal as an input. Thus, only when this signal indicates that this particular word line is selected will the access request clock signal and the boost signal be transmitted to the access control circuit 20.

In this embodiment the boost signal is generated within semiconductor memory 5 using delay circuit 40 and this generated boost signal is routed to a selected one of multiple word lines via the routing circuitry 10. In this embodiment there is a single delay circuit 40 for the whole memory, while in other embodiments there may be multiple delay circuits. There is always one delay circuit for several word lines and this reduces the area of the memory when compared to a memory having a delay circuit for each word line. Having one delay circuit for multiple word lines also provides a more uniform delay to the different word lines and enables this delay to be more easily controlled, where this is desirable. This results in more efficient and central control of the delay and a more uniform boost signal.

Figure 4:
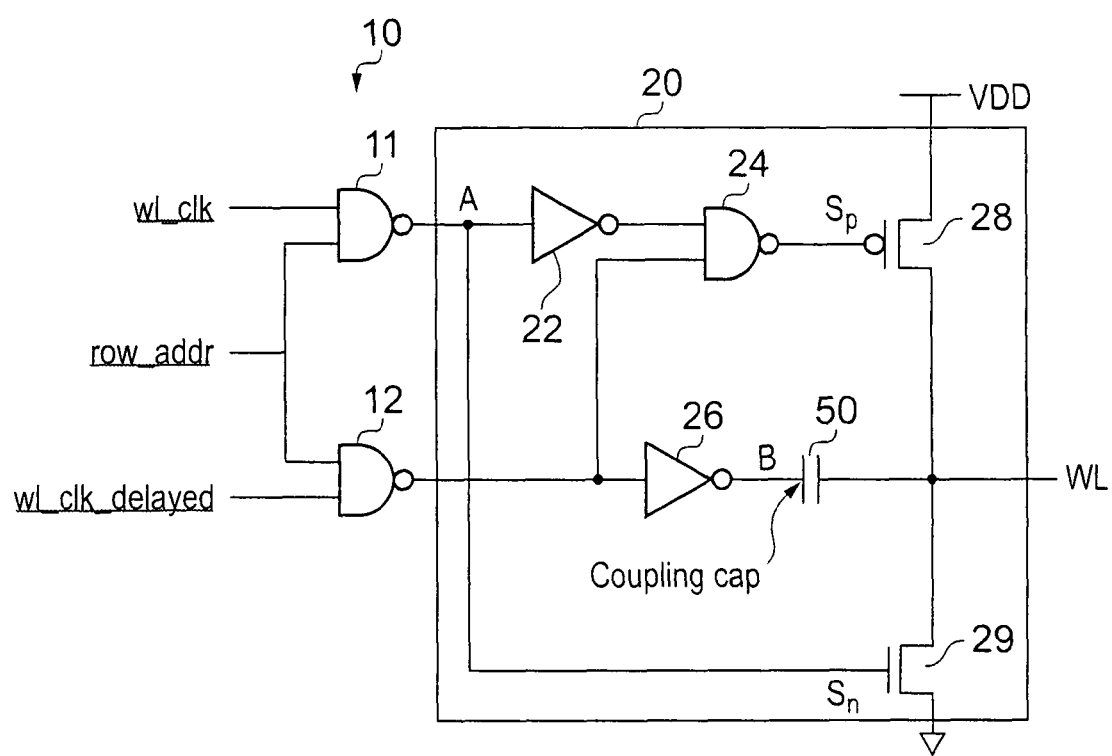
FIG. 4 shows an access control circuit and routing circuitry for a boost signal according to an embodiment of the present invention.

FIG. 4 shows access control circuit 20 and routing circuitry 10 in more detail. Access control circuit 20 comprises coupling capacitor 50. This capacitor may be formed in a number of ways, for example it may be a MOS gate capacitor. It may also in some embodiments be a tuneable capacitor whose capacitance can be varied in response to a control signal so that the amount of boost to the word line voltage can be tuned in dependence upon operating needs. Alternatively, the capacitor may be a capacitor that is tuned at design time and thus, is designed with an appropriate value depending upon the design requirements of a particular memory.

Access control circuit 20 also comprises inverters 22 and 26 for inverting the signals and switches 28 and 29 for charging and discharging the capacitor 50 and word line WL.

Figure 5:
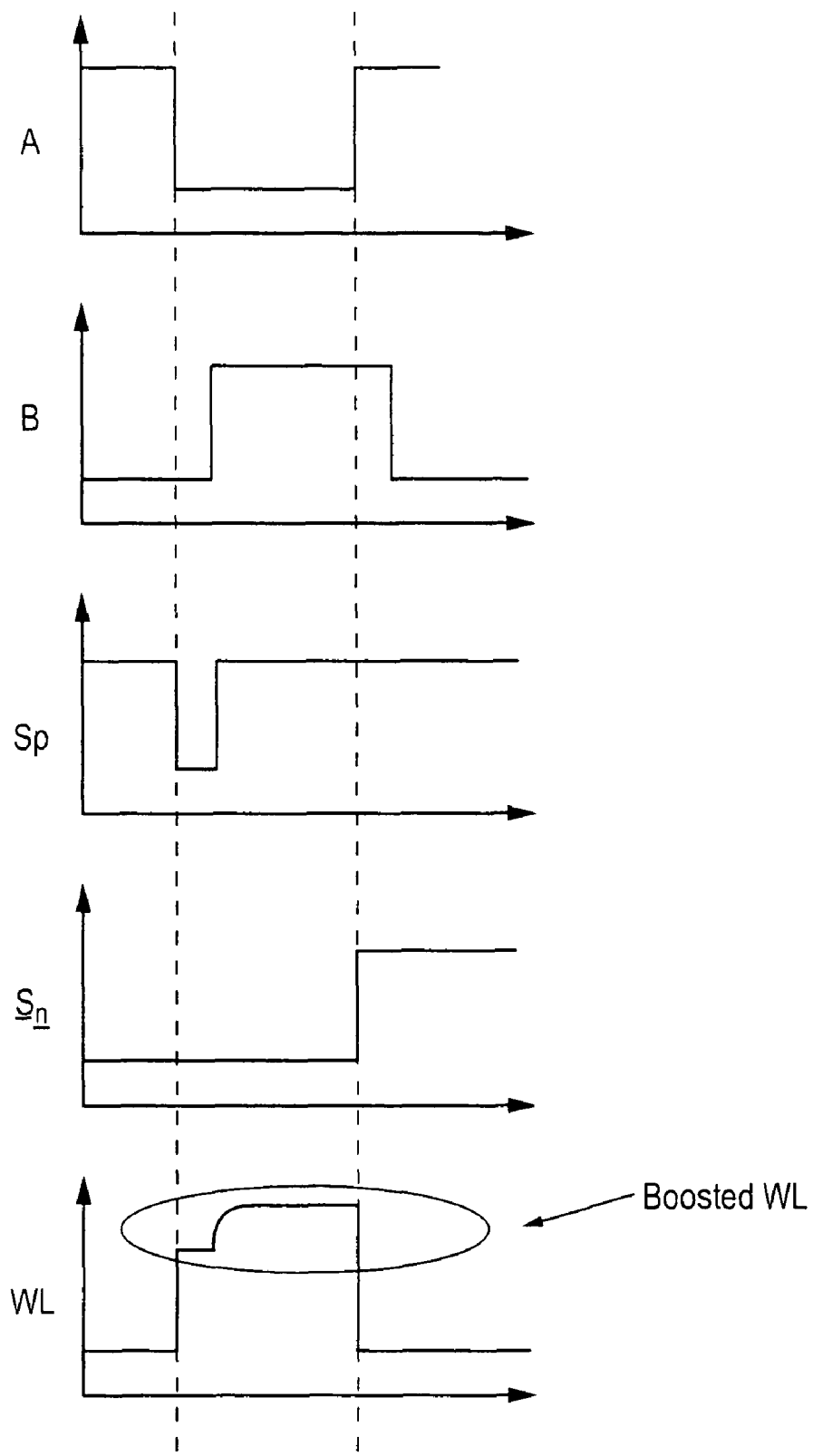
FIG. 5 shows a timing diagram for accessing a storage cell of a memory according to an embodiment of the present invention and FIG. 6 shows a method of accessing a storage cell within a semiconductor memory according to an embodiment of the present invention.

FIG. 5 shows a timing diagram showing the relative timings of the signals controlling the driving of the word line by the circuit of FIG. 4. The clock signal of the access request WL_clk is transmitted through NAND gate 11 when the row address indicates that this is the word line to be selected. An inverted version of this clock signal arrives at node A. Thus, the signal at node A is an inverted version of the access request clock signal WL_clk when this word line is selected.

The signal at node A is then inverted again when it passes through inverter 22 and is input to NAND gate 24. The other input to NAND gate 24 is an input from NAND gate 12 that has the boost signal WL_clk_delayed and the address signal as its inputs. Thus, prior to the boost signal arriving the output signal of NAND gate 12 is high and thus, the output from NAND gate 24 at Sp is low as can be seen from FIG. 5 and thus, the transistor 28 is switched on and the word line WL is pulled up to the supply voltage as is seen in the bottom graph of FIG. 5. This high voltage fires the word line and also acts to precharge capacitor 50.

When the boost signal WL_clk_delayed is received at NAND gate 12, then the output from NAND gate 12 goes low and in response to this signal going low, NAND gate 24 outputs a high signal Sp which turns transistor 28 off. This isolates the word line and capacitor 50 from the supply voltage.

The output from NAND gate 12 is also received by inverter 26 and this inverts the signal so that the signal at B goes high with a delay with respect to the signal at A going low as can be seen from FIG. 5. This signal is coupled to the word line via the charged capacitor 50 and supplies a boost to the voltage as can be seen from the WL graph of FIG. 5.

When clock signal WL_clk goes low, the signal at A goes high and this turns transistor 29 on and couples the word line and capacitor 50 to the low voltage supply which results in the word line voltage and capacitor 50 discharging.

Thus, as can be seen access control circuit 20 and routing circuitry 10 provide the word line with a boosted voltage in response to an access request signal and a boost signal both generated upstream from the access control circuit 20. Furthermore, the delay between firing the word line and boosting this voltage can be controlled by controlling the delay of the boost signal WL_CLK_delayed. As this signal is used to control the boost voltage for several word lines, they will all have the same boost delay applied to them and thus should behave in a uniform manner.

The value of capacitor 50 can be selected to provide the required amount of boost voltage thus, an area efficient controllable circuit is provided that can provide a required boost to the word line voltage depending on circumstances with only a small increase in area of the memory.

The boost voltage level is a function of the ratio of the coupling capacitance to the word line capacitance and thus, in some embodiments the capacitance coupling capacitor 50 can be varied depending on the boost voltage that is required.

As noted a boost to the word line voltage during a write is particularly effective as it increases the probability of a data value being able to successfully overwrite a value that is stored in the feedback loop of the storage cell if required. However, this technique can also be used in some embodiments during reads where it is important that the read is performed at high speed and where the storage cells are particularly stable and thus, unlikely to suffer from read disturb. Increase the word line voltage during a read will increase the speed of the read and thus, the performance of the memory.

Figure 6:
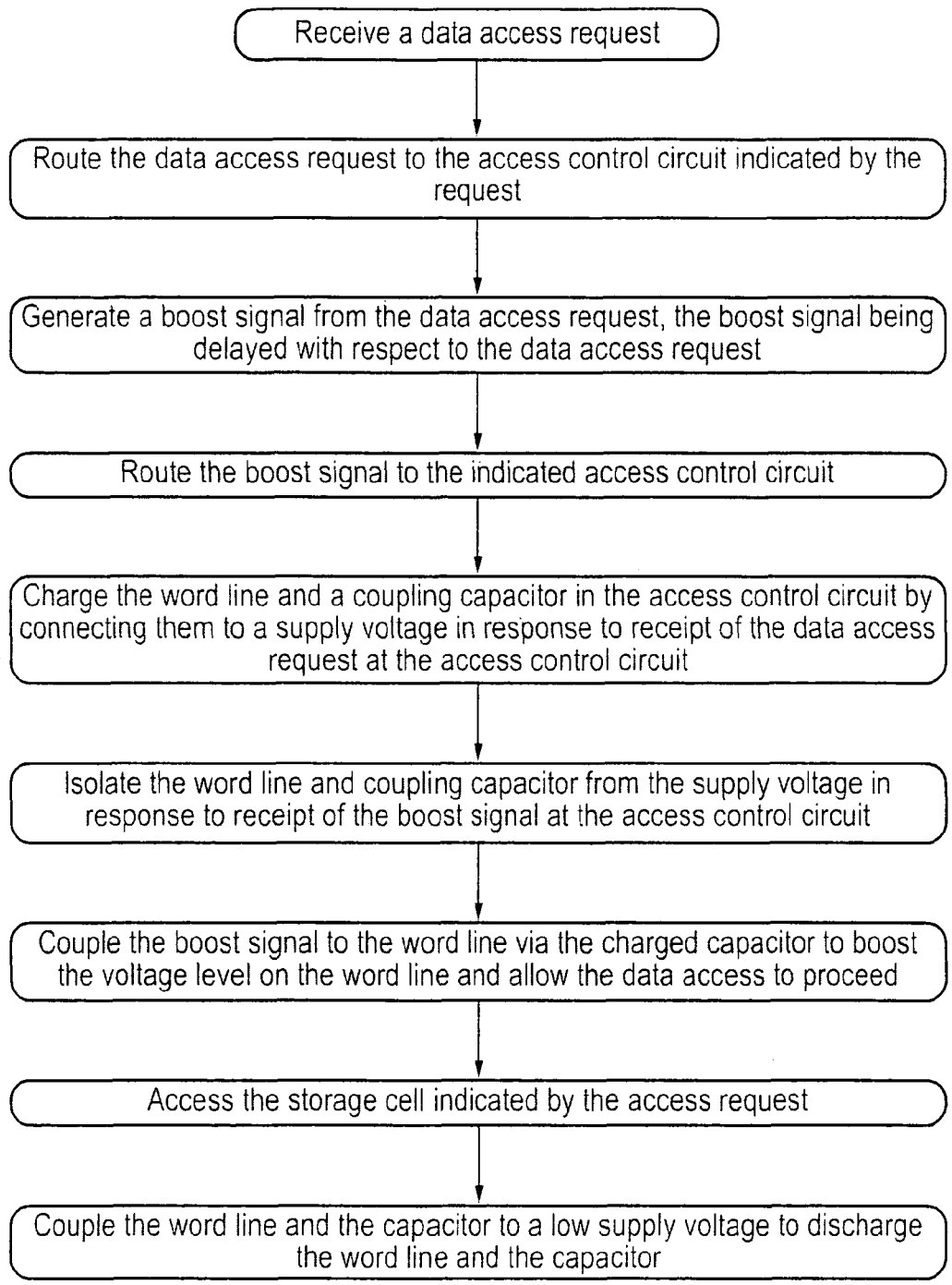

FIG. 6 is a flow diagram illustrating the steps in a method of accessing a storage cell within a semiconductor memory. Initially a data access request is received, and this is routed to the access control circuit that controls access to the word line specified in the access request. A boost signal is generated that is a delayed version of the access request. This boost signal is then routed to the same access control circuit. In response to receipt of the access request the access control circuit fires the word line and charges its coupling capacitor by connecting them both to the supply voltage. In response to receipt of the boost signal the access control circuit then isolates the word line and the coupling capacitor from the supply voltage. It then couples the boost signal to the word line via the charged capacitor to boost the voltage level on the word line and facilitate the data access. The data access to the storage cell indicated in the access request is performed. Finally the word line and the capacitor are connected to a low supply voltage which discharges the word line and the capacitor and the access request is complete.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A semiconductor memory storage device comprising:
a plurality of storage cells for storing data;
at least two access control lines each for controlling access to a respective at least one of said plurality of storage cells;
at least two access control circuits each for controlling a voltage level supplied to a corresponding one of said at least two access control lines in response to an access request, said at least two access control circuits each comprising a capacitor and switching circuitry;
routing circuitry for routing said access request and a boost signal to a selected one of said at least two access control circuits in dependence upon an address associated with said access request; wherein
said at least two access control circuits are each responsive to:
receipt of said access request from said routing circuitry to connect said selected access control line to a supply voltage; and
receipt of said boost signal from said routing circuitry to disconnect said supply voltage from said access control line and to couple said boost signal to said access control line through said capacitor of said access control circuit to provide a boost to a voltage level on said access control line.

2. A semiconductor memory storage device according to claim 1, wherein said semiconductor memory further comprises at least one delay circuit for generating said boost signal from said access request, said routing circuitry being configured to route said boost signal to said selected one of said at least two access control circuit.

3. A semiconductor memory storage device according to claim 1, wherein said semiconductor memory comprises a boost signal input for receiving said boost signal from upstream logic.

4. A semiconductor memory storage device according to claim 1, wherein said at least two access control circuits are each configured to precharge said capacitor of said access control circuit in response to receipt of said access request by said access control circuit.

5. A semiconductor memory storage device according to claim 1, wherein said access request is formed from a clock signal and an address signal, said address signal indicating said access control line to be selected and said clock signal synchronising access to said selected storage cell.

6. A semiconductor memory storage device according to claim 5, wherein said boost signal is generated from said clock signal, and has a delay with respect to said clock signal.

7. A semiconductor memory storage device according to claim 5, wherein said switching circuitry of said access control circuit comprises a switch for connecting said capacitor and access control line to said supply voltage and for isolating said capacitor and access control line from said supply voltage said switch being responsive to said access request and to said boost signal, said switching circuitry comprising a further switch for connecting said access control line and said capacitor to a low voltage supply to discharge said capacitor and access control line, said further switch being responsive to a discharge signal.

8. A semiconductor memory storage device according to claim 7, wherein said discharge signal comprises said clock signal, such that during one phase of said clock signal said further switch connects said access control line and said capacitor to said lower voltage supply, and during the other phase of said clock signal said further switch isolates said access control line and said capacitor from said lower voltage supply, said switch connecting said capacitor and said access control line to said supply voltage during said other phase of said clock signal.

9. A semiconductor memory storage device according to claim 1, wherein said capacitor is a tunable capacitor.

10. A semiconductor memory storage device according to claim 2, wherein said delay circuit is configurable to vary said delay in dependence upon a boost required.

11. A semiconductor memory storage device according to claim 1, wherein said capacitor comprises a MOS gate capacitor.

12. A semiconductor memory storage device according to claim 1, said semiconductor memory comprising an SRAM memory.

13. A semiconductor memory storage device according to claim 1, wherein said access request comprises a write request.

14. A method of accessing a storage cell within a semiconductor memory storage device, said semiconductor memory storage device comprising:
a plurality of storage cells for storing data;
at least two access control lines each for controlling access to a respective at least one of said plurality of storage cells;
at least two access control circuits each for controlling access to a respective one of said at least two access control lines;
routing circuitry; said method comprising the steps of:
receiving an access request;
routing said access request and a boost signal via said routing circuitry to a selected one of said at least two access control circuits in dependence upon an address associated with said access request;
in response to receipt of said access request said selected access control circuit connecting said respective access control line to a supply voltage; and
in response to receipt of said boost signal said selected access control circuit disconnecting said supply voltage from said access control line and coupling said boost signal to said access control line through a capacitor of said access control circuit to provide a boost to a voltage level on said access control line to facilitate said access.

15. A method according to claim 14, comprising a further step of receiving said boost signal following receipt of said access request, said boost signal being associated and delayed with respect to said access request.

16. A method according to claim 14, said method comprising a further step of generating said boost signal from said access request using a delay circuit.

17. A method according to claim 14, comprising a further step of precharging said capacitor in response to receipt of said access request by said access control circuit.

18. A method according to claim 14, wherein said access request is formed from a clock signal and an address signal, said address signal indicating said access control line to be selected and said clock signal synchronising access to said selected storage cell.

19. A method according to claim 18, said method comprising the further step of connecting said access control line and said capacitor to a low voltage supply to discharge said capacitor and access control line in response to a discharge signal.

20. A semiconductor means for storing data comprising:
a plurality of storage cell means;
at least two access control line means each for controlling access to a respective at least one of said plurality of storage cell means;
at least two access control means each for controlling a voltage level supplied to a corresponding one of said at least two access control line means in response to an access request, said at least two access control means each comprising capacitor and switching means;
routing means for routing said access request and a boost signal to a selected one of said at least two access control means in dependence upon an address associated with said access request; wherein
said at least two access control means are each responsive to:

receipt of said access request from said routing means to connect said selected access control line means to a supply voltage; and receipt of said boost signal from said routing means to disconnect said supply voltage from said access control line means and to couple said boost signal to said access control line means through said capacitor of said access control means to provide a boost to a voltage level on said access control line means.

* * * * *